United States Patent
Lee et al.

(10) Patent No.: US 7,368,778 B2
(45) Date of Patent: May 6, 2008

(54) DRAM HAVING AT LEAST THREE LAYERED IMPURITY REGIONS BETWEEN CHANNEL HOLES AND METHOD OF FABRICATING SAME

(75) Inventors: Jin-Woo Lee, Suwon-si (KR);
Yong-Sung Kim, Yongin-si (KR);
Tae-Young Chung, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 197 days.

(21) Appl. No.: 11/210,705

(22) Filed: Aug. 25, 2005

(65) Prior Publication Data
US 2006/0049445 A1    Mar. 9, 2006

(30) Foreign Application Priority Data
Sep. 9, 2004    (KR) .................... 10-2004-0072354

(51) Int. Cl.
*H01L 27/108*    (2006.01)
*H01L 29/76*    (2006.01)
*H01L 29/94*    (2006.01)
*H01L 31/119*    (2006.01)

(52) U.S. Cl. ............... 257/306; 257/330; 257/E27.086; 257/E27.096

(58) Field of Classification Search ........ 257/295–310, 257/E27.086, E27.096
See application file for complete search history.

(56) References Cited

U.S. PATENT DOCUMENTS 6,380,045 B1 * 4/2002 Guo .................... 438/396
6,570,233 B2    5/2003 Matsumura
6,844,591 B1 * 1/2005 Tran .................... 257/330

FOREIGN PATENT DOCUMENTS

| JP | 11-026609 | 1/1999 |
|---|---|---|
| KR | 1997-0004070 | 1/1997 |
| KR | 1998-048381 | 9/1998 |
| KR | 1020040008725 A | 1/2004 |

* cited by examiner

*Primary Examiner*—Cuong Nguyen
(74) *Attorney, Agent, or Firm*—Volentine & Whitt, PLLC

(57) ABSTRACT

Disclosed is a dynamic random access memory (DRAM) comprising a transistor having channel holes formed in the channel region thereof and cell gate structures formed in the channel holes. At least three layered impurity regions are formed in a semiconductor substrate between the channel holes and the at least three layered impurity regions form a source region for the transistor.

17 Claims, 14 Drawing Sheets

DRAM HAVING AT LEAST THREE LAYERED IMPURITY REGIONS BETWEEN CHANNEL HOLES AND METHOD OF FABRICATING SAME

BACKGROUND OF THE INVENTION

1. Field of the Invention

The invention relates generally to a dynamic random access memory (DRAM) and a method of fabricating the same. More particularly, the invention relates to a DRAM having at least three layered impurity regions formed between channel holes in an active region of the DRAM and a method of fabricating the same.

A claim of priority is made to Korean Patent Application No. 10-2004-0072354 filed Sep. 9, 2004, the disclosure of which is hereby incorporated by reference in its entirety.

2. Discussion of the Related Art

A dynamic random access memory (DRAM) typically comprises an array of transistors connected to a corresponding set of bitlines and wordlines. Each transistor generally comprises a source and a drain formed in a semiconductor substrate and a gate formed on the semiconductor substrate so as to overlap the source and the drain. The transistor typically further comprises a channel region formed in the semiconductor substrate between the source and drain. The channel region functions as a route for transferring electrical charges between the source and the drain.

As the size of a DRAM decreases, the length of each channel region within the DRAM typically undergoes a corresponding decrease. Due to a phenomenon called the "short channel effect", the decrease in the channel length may result in a corresponding decrease in the threshold voltage of the transistor.

In an effort to overcome the short channel effect, a transistor having a trench-shaped channel hole formed in a semiconductor substrate has been developed. The trench-shaped channel hole is connected to a word line and functions as a channel region for the DRAM. The channel region transfers charges between source and drain regions along the semiconductor substrate defining the channel hole. The channel hole effectively increases the length of the channel because the distance around the channel hole is longer than the distance across the channel hole.

Unfortunately, transistors using a channel hole to increase the effective length of the channel often experience another phenomenon known as "punch-through". Punch-through occurs where the drain depletion region and the source depletion region of a transistor overlap, essentially creating a single depletion region. Punch-through typically causes current to rapidly increase as the drain-source voltage is increased.

Punch-through typically occurs where the diameter of the channel hole is so small that impurity ions in the source and drain regions pass directly through the channel hole, thereby increasing a possibility of overlapping each other. In addition, reducing the channel length of a transistor in a DRAM also increases a possibility that impurity ions in the source and drain regions facing each other about the channel portion hole contact along the channel region.

U.S. Pat. No. 6,570,233 (the '233 patent) discloses a method of fabricating an integrated circuit. According to the method, source and drain regions are formed in a semiconductor substrate and a gate is formed on the semiconductor substrate so as to overlap the source and drain regions. An insulating layer is then formed to cover the transistor and a contact hole is formed in the insulating layer. A thin first layer is formed on one of the source and drain regions to cover the contact hole. The first layer is formed using a conductive material having a first concentration of dopants. Next, a second layer is formed to cover the first layer. The second layer is formed using a conductive material having a second concentration of dopants which is lower than the first concentration of dopants. Together, the first and second layers form a contact plug.

After the first layer is formed, impurity ions having a first energy level are injected into at least one of the source and drain regions. Then, impurity ions having a second energy level higher than the first energy level are injected into the at least one of the source and drain regions via the first layer. By doing so, a contact resistance between the contact plug and the semiconductor substrate are reduced.

Although the method uses complicated processes in order to reduce the contact resistance between the contact plug and the semiconductor substrate, a problem arises where ions from the ion implantation processes and dopants in the contact plug are excessively diffused, thereby causing a short channel effect.

Because of at least these problems, improved DRAM manufacturing techniques are needed.

SUMMARY OF THE INVENTION

Embodiments of the invention simultaneously address the short-channel and punch-through effects in the transistors of DRAM cells. Accordingly, DRAM cells according to selected embodiments of the invention maintain stable electrical characteristics while allowing each DRAM cell to be manufactured within a minute area.

According to one embodiment of the invention, a DRAM is provided. The DRAM comprises a device isolation layer formed in a semiconductor substrate and defining an active region of the semiconductor substrate. Two channel holes are formed in the active region and surrounded by the device isolation layer. Cell gate structures are formed in the channel holes and running gate structures are formed on the device isolation layer.

The DRAM further comprises first impurity regions formed in the semiconductor substrate between adjacent cell gate structures and between adjacent cell and running gate structures, and second and third impurity regions formed in the semiconductor substrate below the first impurity region and between the adjacent cell gate structures. The cell gate structures extend upward from the semiconductor substrate and are formed in parallel with the running gate structures. The first and second impurity regions have a first conductivity type and the third impurity region has a second conductivity type.

According to another embodiment of the present invention, a method of fabricating a DRAM is provided. The method comprises forming a device isolation layer in a semiconductor substrate to define an active region of the semiconductor substrate, forming two channel holes in the active region of the semiconductor substrate, and forming cell gate structures filling the channel holes.

The method further comprises forming running gate structures on the device isolation layer and performing an ion implantation process on the semiconductor substrate using the cell and running gate structures as a mask, thereby forming first impurity regions in the semiconductor substrate.

Finally, the method comprises forming second and third impurity regions in the semiconductor substrate below the first impurity region and between the cell gate structures.

The cell gate structures extend upward from the semiconductor substrate and are formed in parallel with the running gate structures. In addition, the first and second impurity regions have a first conductivity type, and the third impurity region has a second conductivity type.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
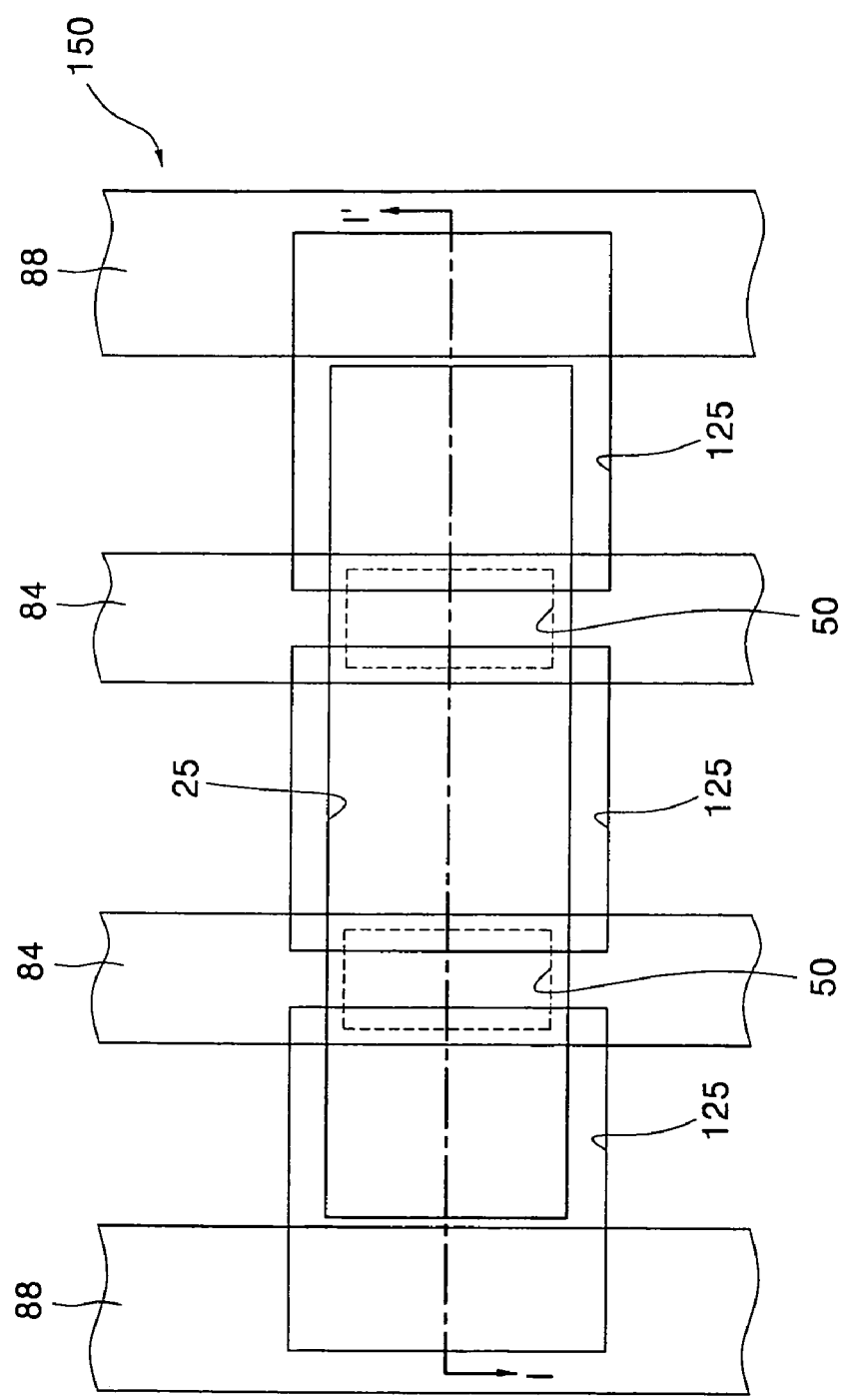
FIG. 1 is a top view of a DRAM according to one embodiment of the invention.
Figure 2:
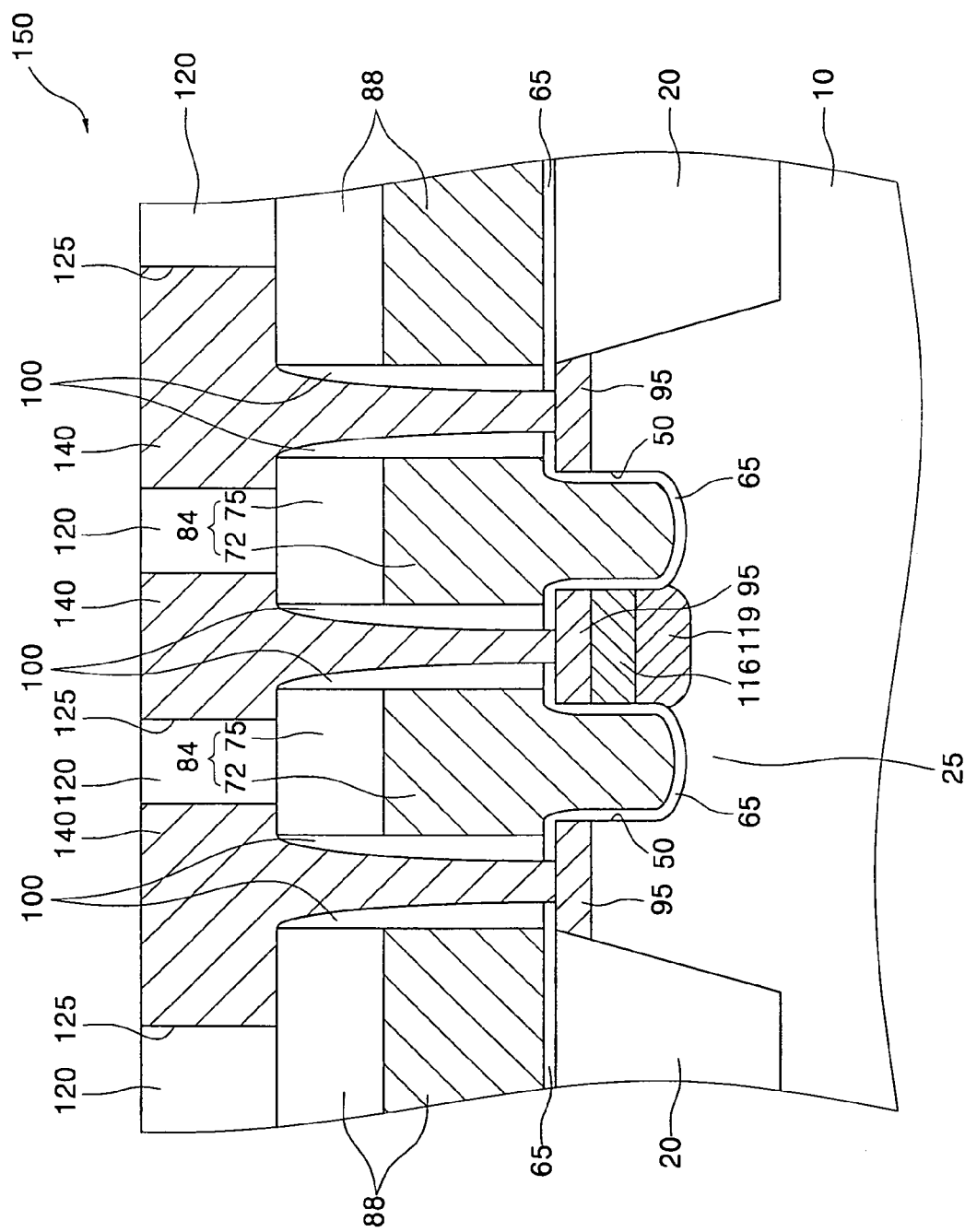
FIG. 2 is a cross-sectional view of the DRAM taken along a line between points I and I' in FIG. 1; and, FIGS. 3 through 14 are cross-sectional views illustrating a method of fabricating the DRAM shown in FIGS. 1 and 2 according to an embodiment of the invention.

FIG. 1 is a top view of a dynamic random access memory (DRAM) according to an embodiment of the invention and FIG. 2 is a cross-sectional view of the DRAM taken along a line between points I and I' in FIG. 1.

Referring to FIGS. 1 and 2, a DRAM 150 comprises a device isolation layer 20 formed in a semiconductor substrate 10. The device isolation layer defines an active region 25 in semiconductor substrate 10. Device isolation layer 20 preferably comprises a silicon oxide (e.g., $SiO_2$) layer and semiconductor substrate 10 preferably has a p-type conductivity.

A well region (not shown) is typically formed in active region 25. The well region preferably has the same conductivity type as semiconductor substrate 10. A plurality of channel holes 50 are formed in active region 25 of semiconductor substrate 10. Channel holes 50 are spaced apart from each other by a predetermined distance and are surrounded by device isolation layer 20. Preferably, the number of channel holes 50 formed in semiconductor substrate 10 is two (2).

Cell gate structures 84 are formed in channel holes 50 and running gate structures 88 are formed on device isolation layer 20. Cell gate structures 84 fill channel holes 50 and protrude upward from the main surface of semiconductor substrate 10 so as to be parallel with running gate structures 88. Each of cell gate structures 84 and running gate structures 88 is composed of a gate 72 and a gate capping structure 75 stacked on gate 72.

Gate capping structure 75 preferably comprises an insulating layer having a different etch rate from device isolation layer 20. For example, gate capping structure 75 may comprise a silicon nitride (e.g., $Si_3N_4$) layer.

Gate 72 preferably comprises an n+-type polysilicon layer and a metal silicide layer, stacked sequentially. Alternatively, gate 72 may be formed of an n+-type polysilicon layer only.

First impurity regions 95 are formed between adjacent cell gate structures 84 and adjacent running gate structures 88. Preferably, first impurity regions 95 are doped with n--type impurity ions.

First through third impurity regions 95, 116, and 119 are formed in semiconductor substrate 10 between channel holes 50. Second impurity region 116 is formed on third impurity region 119 and first impurity region 95 is formed on second impurity region 116. Preferably, first and second impurity regions 95 and 116 have a same conductivity type and second and third impurity regions 116 and 119 have different conductivity types. Also, third impurity region 119 preferably has the same conductivity type as semiconductor substrate 10.

While the embodiment of the invention shown in FIG. 2 contains three stacked impurity regions formed between channel holes 50, other embodiments of the invention may contain more than three impurity regions.

A gate insulating pattern 65 is formed between cell gate structures 84 and semiconductor substrate 10 and between running gate structures 88 and device isolation layer 20. Gate insulating pattern 65 preferably comprises an insulating layer having a different etch rate from gate capping layer pattern 75 and the same etch rate as device isolation layer 20.

A pad insulating interlayer 120 is formed on cell gate structures 84 and running gate structures 88. Pad insulating interlayer 120 separates a plurality of pad holes 125 extending down to semiconductor substrate 10 though spaces between adjacent running gate structures 88 and cell gate structures 84. Pad insulating interlayer 120 preferably comprises a silicon oxide layer containing boron (B) and phosphorus (P). Pad holes 125 are filled by landing pads 140, which contact first impurity regions 95. Landing pad 140 is preferably an n+-type polysilicon layer.

Gate spacers 100 are respectively interposed between landing pads 140 and cell gate structures 84, and between landing pads 140 and running gate structures 88. Gate spacers 100 cover sidewalls of cell gate structures 84 and running gate structures 88. Gate spacers 100 are preferably formed of an insulating layer having a different etch rate from pad insulating interlayer 120 and the same etch rate as gate capping structure 75.

FIGS. 3 through 14 are cross-sectional views illustrating a method of fabricating the DRAM shown in FIG. 1. The cross-sectional views shown in FIGS. 3 through 14 are taken along a line between points I and I' in FIG. 1.

Figure 3:
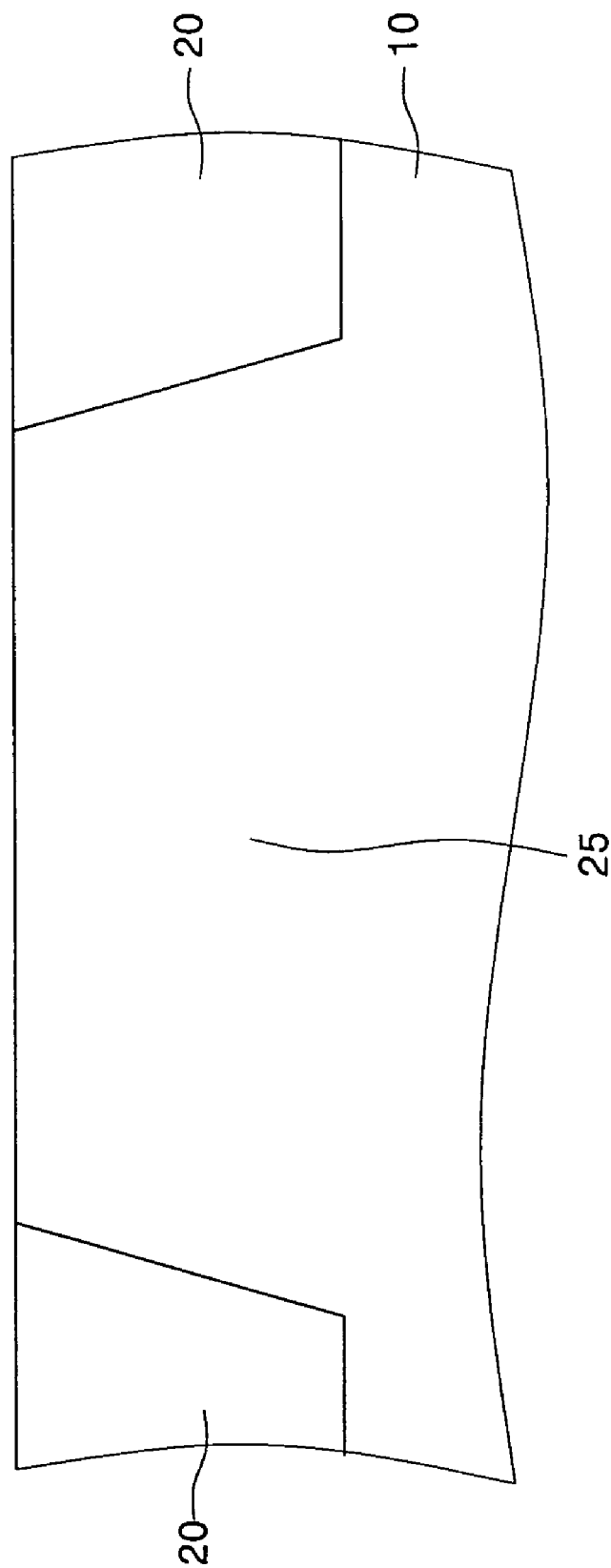

Referring to FIG. 3, a device isolation layer 20 is formed in a semiconductor substrate 10. Device isolation layer 20 defines an active region 25 in semiconductor substrate 10. Device isolation layer 20 preferably comprises a silicon oxide (e.g., $SiO_2$) layer and semiconductor substrate 10 preferably has a p-type conductivity.

After device isolation layer 20 is formed, a well region (not shown) is formed in active region 25 of semiconductor substrate 10. Preferably, the well region has the same conductivity type as semiconductor substrate 10.

Figure 4:
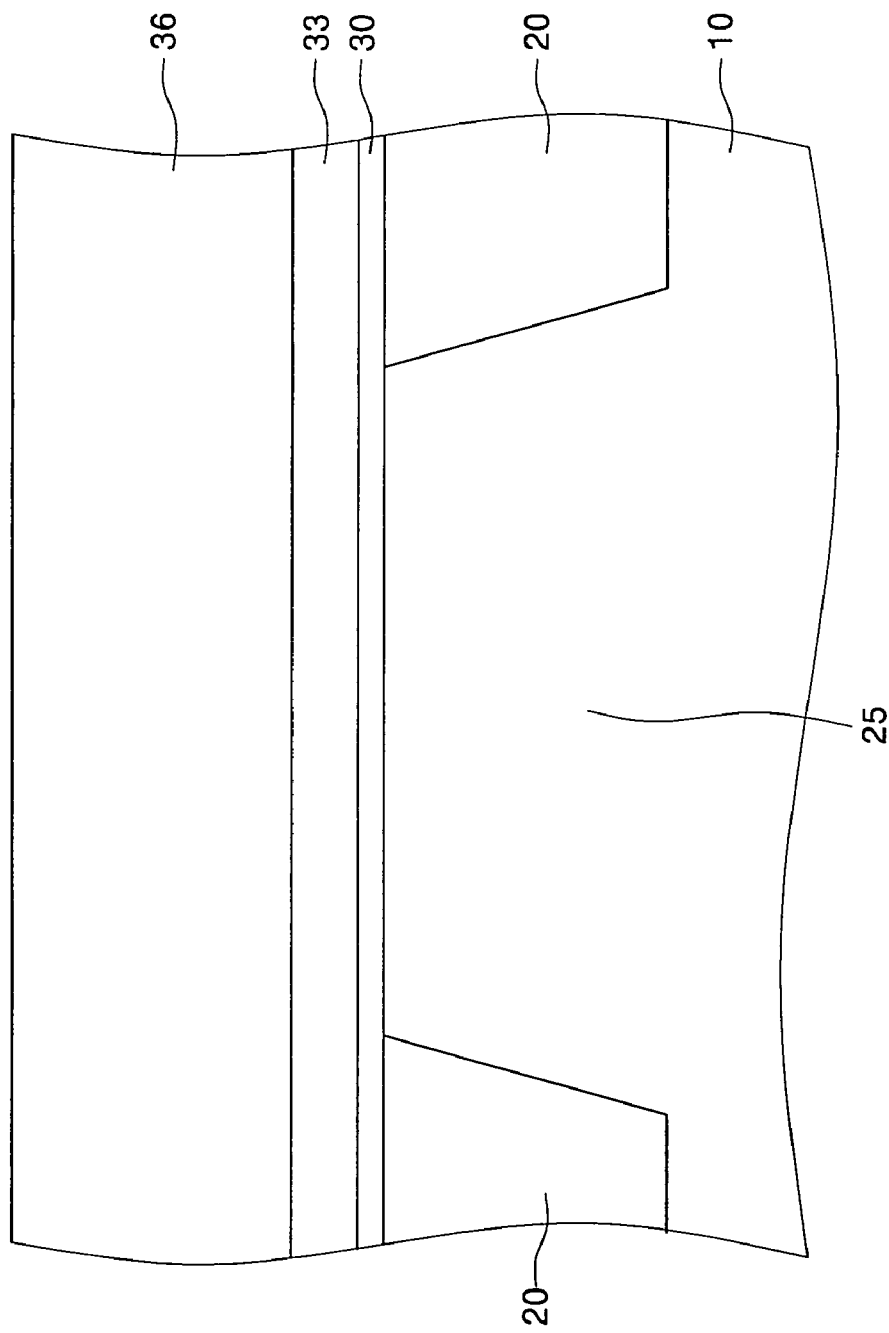

Referring to FIG. 4, a buffer layer 30, a mask layer 33 and a photoresist layer 36 are sequentially formed on semiconductor substrate 10 to cover device isolation layer 20. Mask layer 33 preferably comprises an insulating layer having a different etch rate from buffer layer 30. For example, mask layer 33 preferably comprises a silicon nitride (e.g., $Si_3N_4$) layer and buffer layer 30 preferably comprises a silicon oxide layer.

Figure 5:
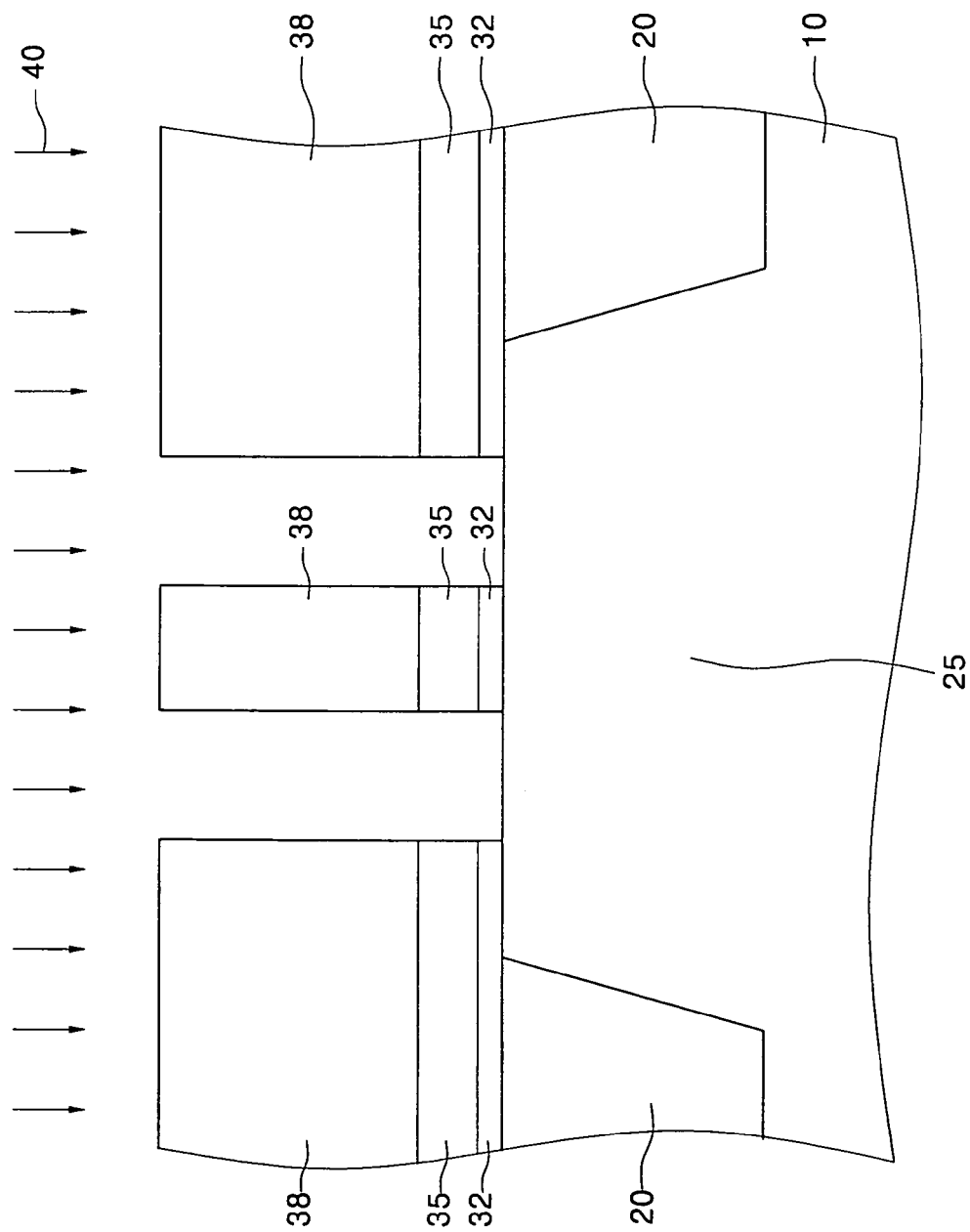

Referring to FIG. 5, a photolithography process is performed on photoresist layer 36 to produce a photoresist pattern 38 containing two holes on mask layer 33. The holes are preferably formed over active region 25 of semiconductor substrate 10.

Using photoresist pattern 38 as an etching mask, an etching process 40 is performed on mask layer 33 and buffer layer 30 to produce a mask layer pattern 35 and a buffer layer pattern 32, respectively. Semiconductor substrate 10 is exposed through mask layer pattern 35 and buffer layer pattern 32. Once buffer layer pattern 32 and mask layer pattern 35 are formed, photoresist pattern 38 is removed from semiconductor substrate 10.

According to another embodiment(not shown), an etching process 40 may be sequentially performed on mask layer 33 and buffer layer 30 to produce a mask layer pattern 35 and a buffer layer pattern 32, respectively, using photoresist pattern 38 as an etching mask. Semiconductor substrate 10 is exposed through mask layer pattern 35 and buffer layer pattern 32.

According to still another embodiment(not shown), an etching process 40 may be not performed on mask layer 33 and buffer layer 30 to expose substrate 10.

Figure 6:
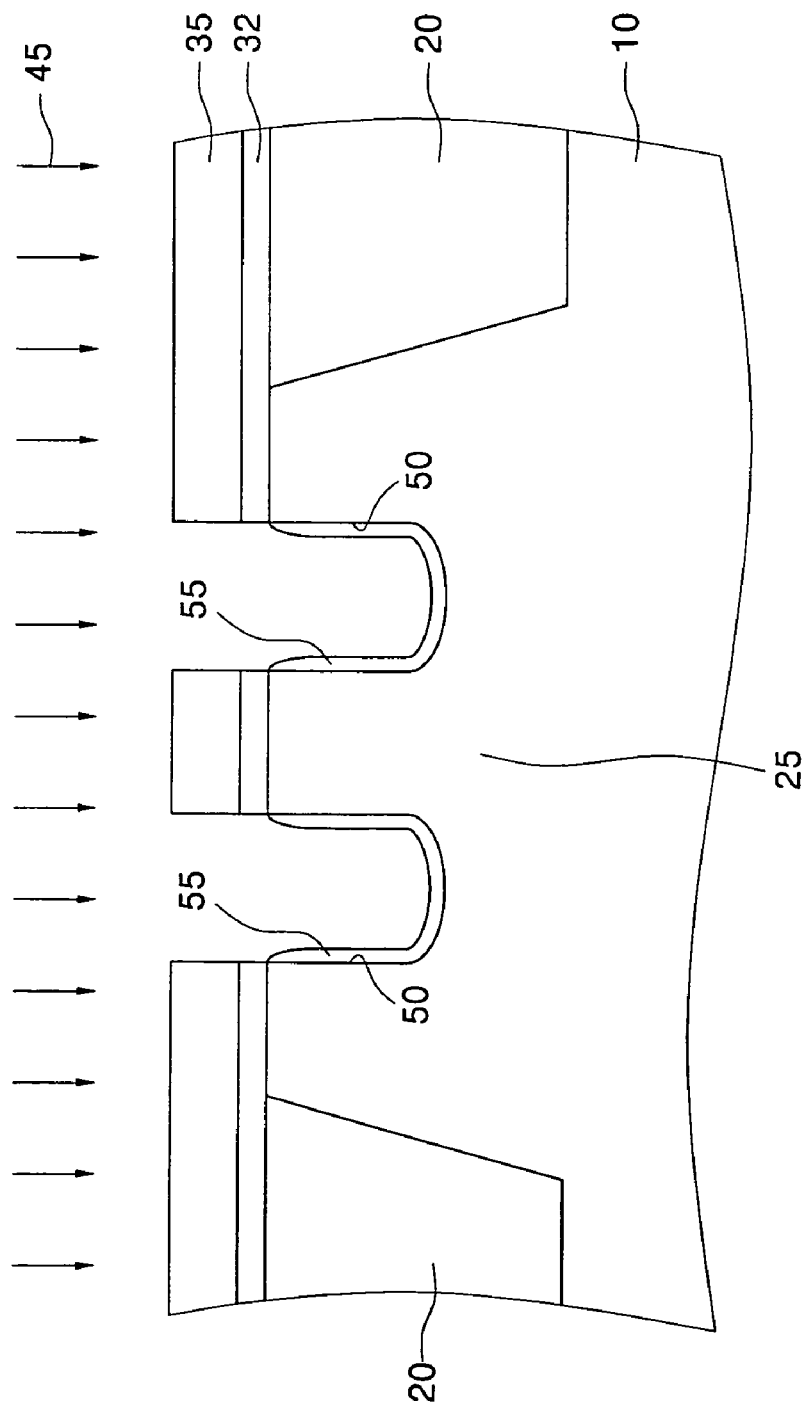

Referring to FIG. 6, an etching process 45 is performed on semiconductor substrate 10 using mask layer pattern 35 and buffer layer pattern 32 as a mask. Etching process 45 creates channel holes 50 in semiconductor substrate 10. Channel holes 50 are surrounded by device isolation layer 20 and are preferably formed to extend downward in semiconductor substrate 50 in parallel with each other.

According to another embodiment, an etching process 45 may be performed on the substrate 10 using photoresist pattern 38, mask layer pattern 35 and buffer layer pattern 32 as an etching mask. Etching process 45 creates channel holes 50 in semiconductor substrate 10. Channel holes 50 are surrounded by device isolation layer 20 and are preferably formed to extend downward in semiconductor substrate 50 in parallel with each other. Once the substrate 10 are etched, the photoresist pattern 38, the mask layer pattern 35 and the buffer layer pattern 32 may be sequentially removed.

According to yet another embodiment, in a case where the etching process 40 described above in relation to FIG. 5 is not performed on mask layer 33 and buffer layer 30 to expose substrate 10, an etching process 45 may be sequentially performed on mask layer 33, buffer layer 30 and substrate 10 to produce a mask layer pattern 35 and a buffer layer pattern 32, using photoresist pattern 38 as an etching mask. Etching process 45 creates channel holes 50 in semiconductor substrate 10. Channel holes 50 are surrounded by device isolation layer 20 and are preferably formed to extend downward in semiconductor substrate 50 in parallel with each other. Then, photoresist pattern 38, the mask layer pattern 35 and the buffer layer pattern 32 may be sequentially removed.

Referring back to FIG. 6, using mask layer pattern 35 and buffer layer pattern 32 as a mask, a sacrificial layer 55 is formed in each of channel holes 50. Sacrificial layer 55 is typically formed of a silicon oxide. Sacrificial layer 55, mask layer pattern 35 and buffer layer patterns 32 are then removed from semiconductor substrate 10.

According to another embodiment, a sacrificial layer 55 may be formed on the substrate 10 to conformally cover channel holes 50. Sacrificial layer 55 is typically formed of a silicon oxide. Sacrificial layer 55 may be then removed from semiconductor substrate 10.

According to still another embodiment, a sacrificial layer 55 may be formed on the substrate 10 to conformally cover channel holes 50. Sacrificial layer 55 is typically formed of a silicon oxide. Sacrificial layer 55 may be then removed from semiconductor substrate 10.

Figure 7:
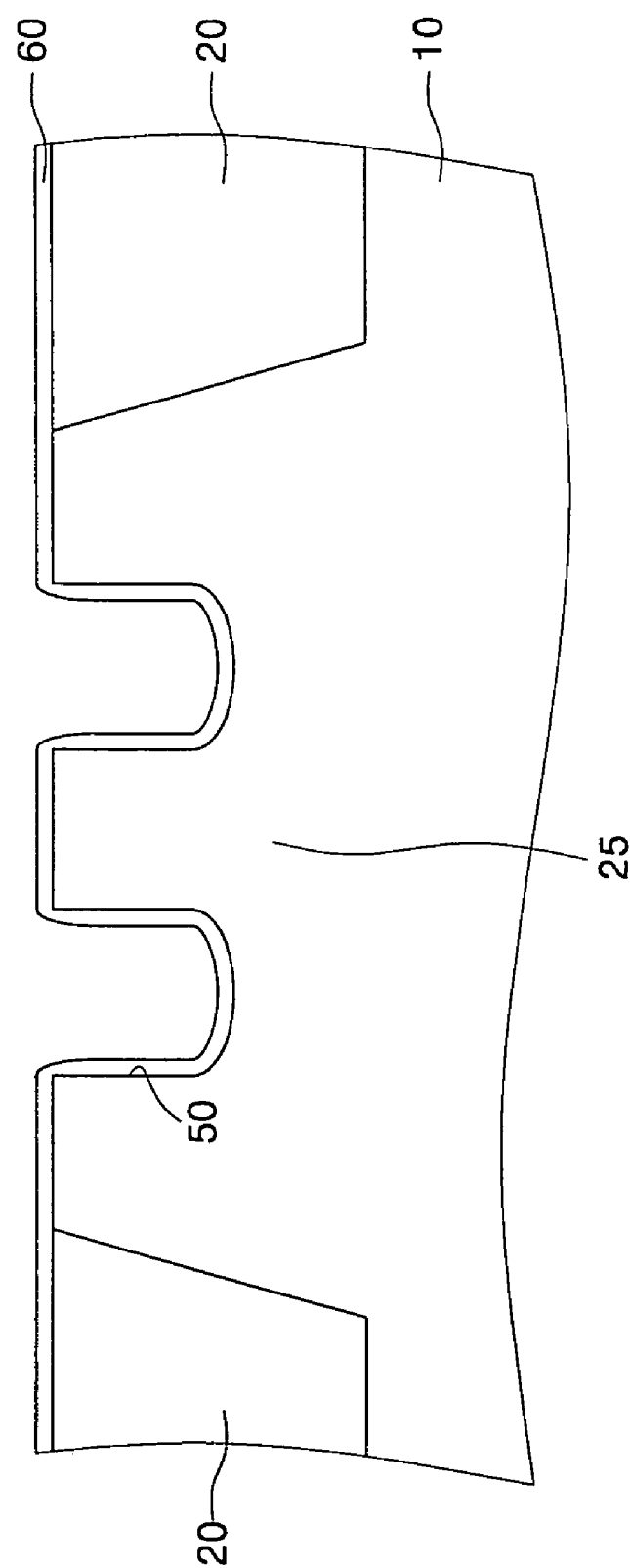

Referring to FIG. 7, a gate insulating layer 60 is formed on device isolation layer 20 and semiconductor substrate 10 to cover channel holes 50. Gate insulating layer 60 is preferably formed using silicon oxide.

Figure 8:
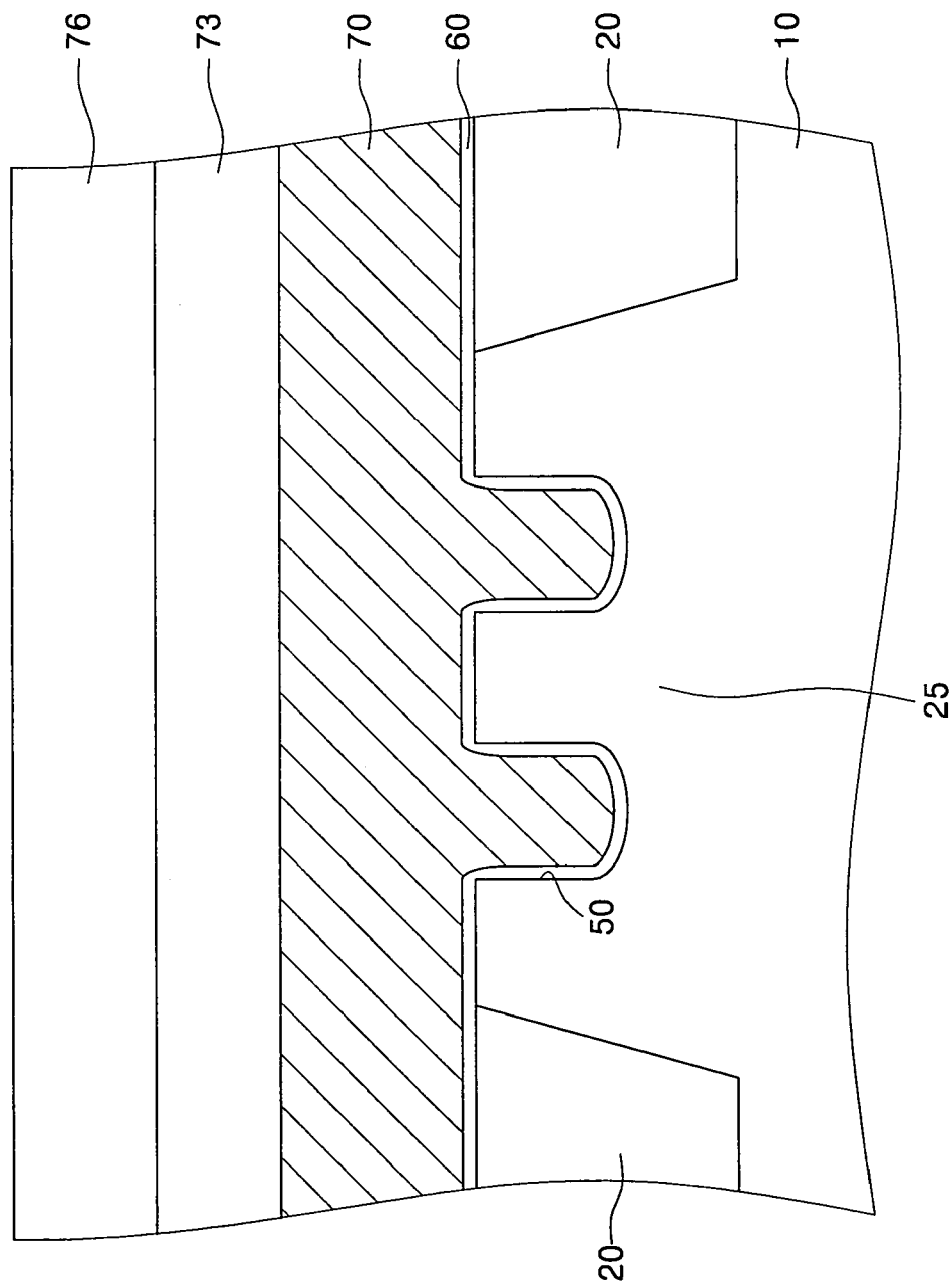

Referring to FIG. 8, a gate layer 70 filling channel holes 50, a gate capping layer 73, and a photoresist layer 76 are sequentially formed on gate insulating layer 60. Gate capping layer 73 is preferably formed using an insulating layer having a different etch rate from gate insulating layer 60. Gate layer 70 is preferably formed using an n+-type polysilicon layer and a metal silicide layer, which are sequentially stacked. Alternatively, gate layer 70 may be formed of only an n+-type polysilicon layer.

Figure 9:
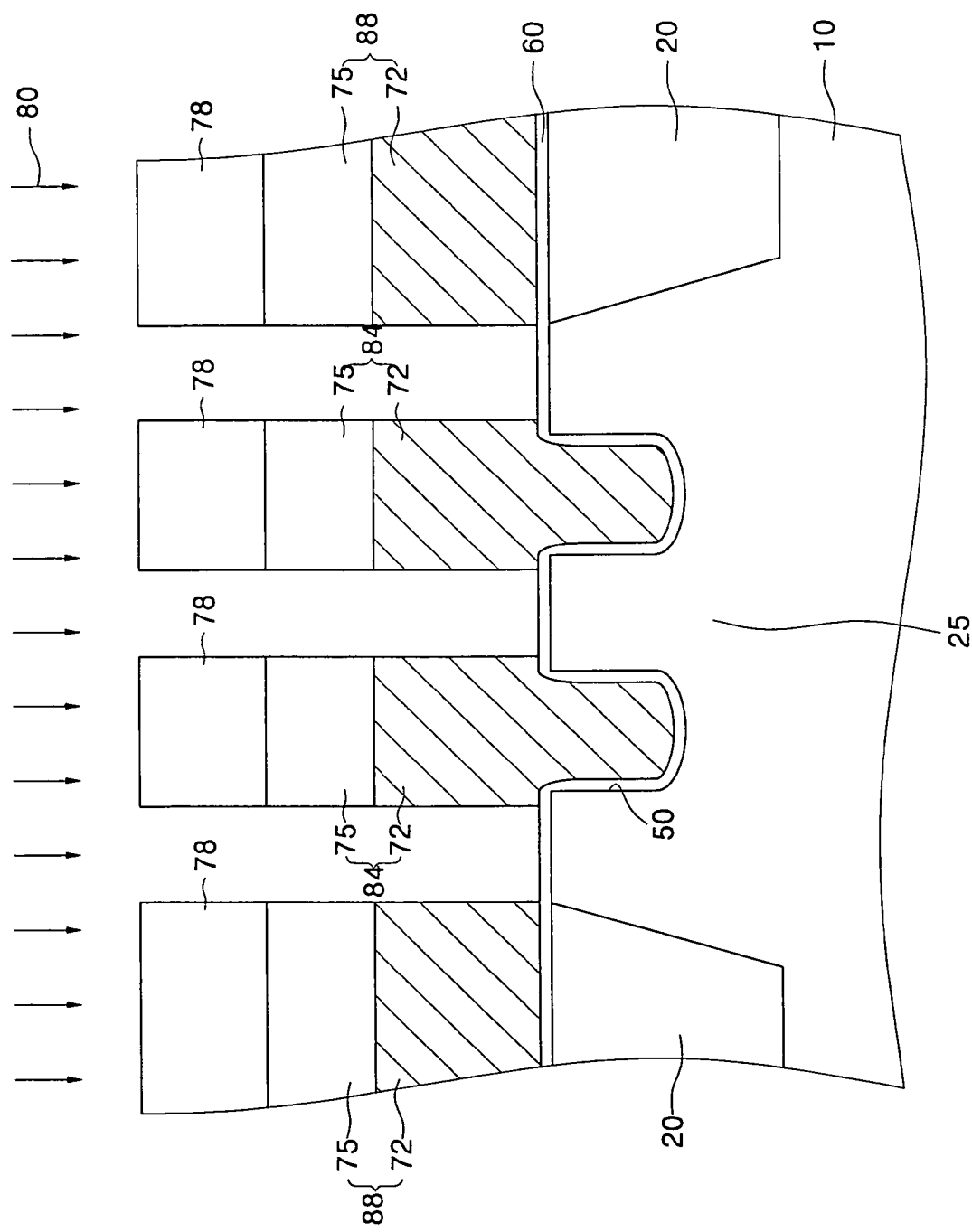

Referring to FIG. 9, a photolithography process is performed on photoresist layer 76 to form a photoresist pattern 78 on gate capping layer 73. Photoresist pattern 78 preferably comprises a plurality of lines spaced apart from each other by a predetermined distance. Using photoresist pattern 78 as an etching mask, an etching process 80 is performed on gate capping layer 73 and gate layer 70 to form gate capping structures 75 and gates 72, respectively, on insulating layer 60. Following etching process 80, insulating layer 60 is exposed through holes formed between gate capping structures 75 and gates 72.

Collectively, gate capping structures 75 and gates 72 form cell gate structures 84 over channel holes 50 and running gate structures 88 over device isolation layer 20. Cell gate structures 84 fill channel holes 50 and protrude upward from semiconductor substrate 10 in parallel with running gate structures 88.

Figure 10:
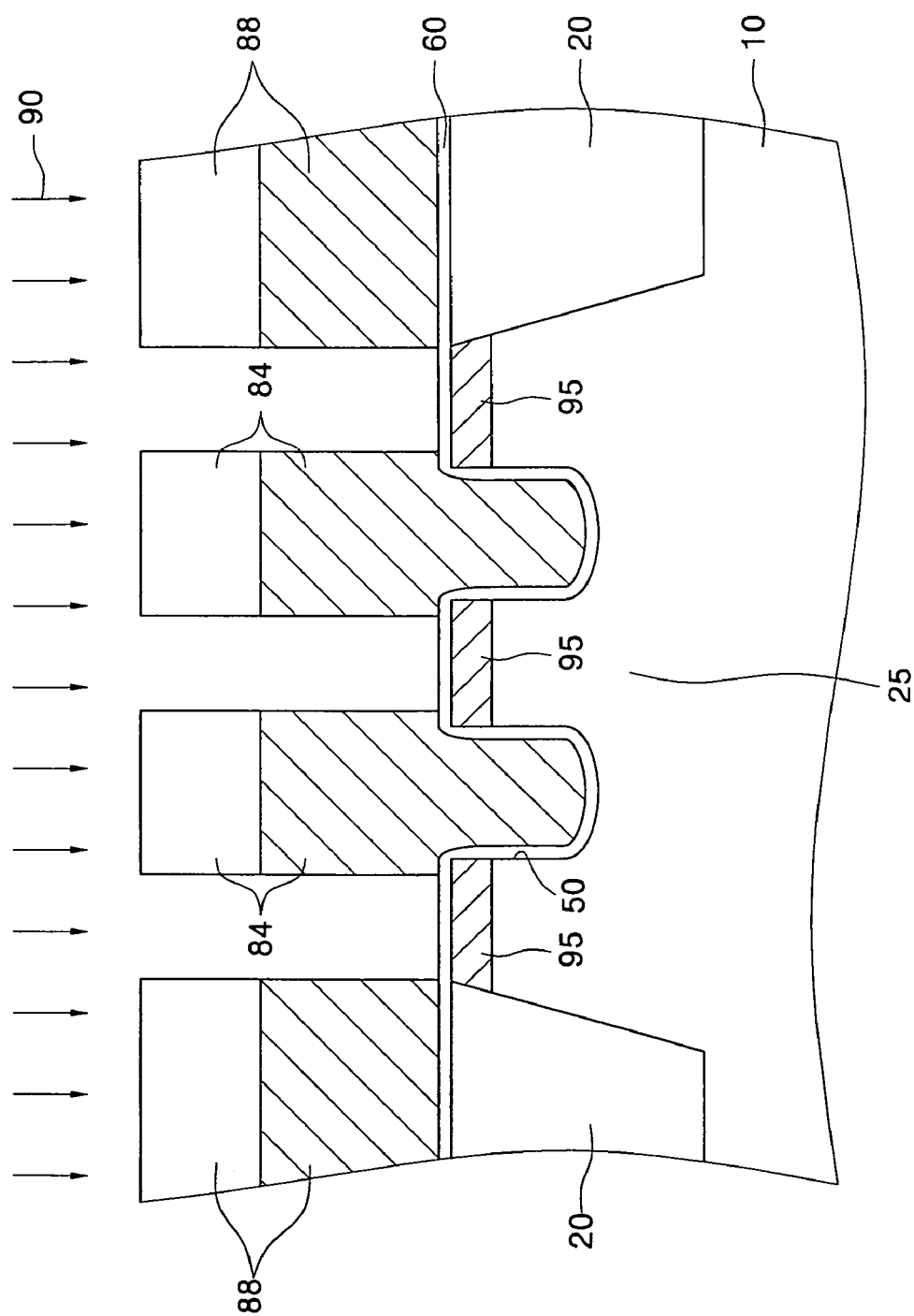

Referring to FIG. 10, photoresist pattern 78 is removed from semiconductor substrate 10. Using the cell and running gate structures 84 and 88 as a mask, an ion implantation process 90 is performed on semiconductor substrate 10 to form first impurity regions 95. First impurity regions 95 are formed in semiconductor substrate 10 so as to overlap cell and running gate structures 84 and 88. First impurity regions 95 are preferably formed with an n--type conductivity.

Figure 11:
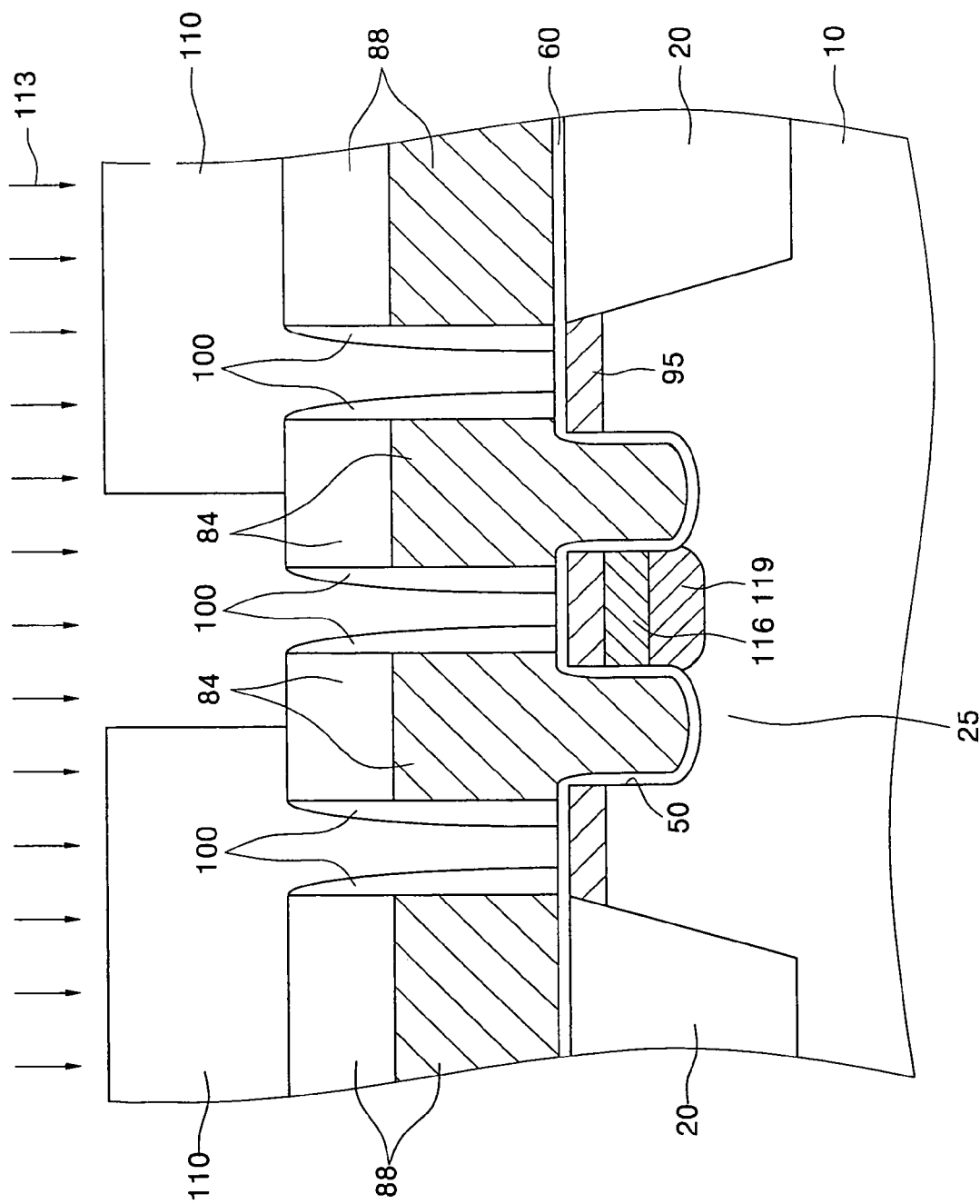

Referring to FIG. 11, gate spacers 100 are then formed on sidewalls of cell and running gate structures 84 and 88. Gate spacers 100 are preferably formed using an insulating layer having a different etch rate from gate insulating layer 60. Gate spacers 100 are preferably formed using an insulating layer having the same etch rate as gate capping layer 73. Gate spacers 100 are preferably formed using silicon nitride.

A photoresist pattern 110 having a hole is then formed on gate capping layer pattern 75. Photoresist pattern 110 covers portions of gate capping structures 75 above spaces between cell and running gate structures 84 and 88. However, the hole in photoresist pattern 110 exposes a space between adjacent cell gate structures 84.

Using photoresist pattern 110, cell gate structures 84, and gate spacers 100 as a mask, an ion implantation process 113 is performed twice on semiconductor substrate 10 to form second and third impurity regions 116 and 119 between channel holes 50. Second and third impurity regions 116 and 119 are formed sequentially under first impurity region 95. Preferably, third impurity region 119 is formed below second impurity region 116. Following ion implantation process 113, photoresist pattern 110 is removed from semiconductor substrate 10.

First and second impurity regions 95 and 116 preferably have the same conductivity type and second and third impurity regions 116 and 119 preferably have different conductivity types. Third impurity region 119 is preferably formed to have the same conductivity type as semiconductor substrate 10.

By forming second and third impurity regions 116 and 119 between channel holes 50, a short channel effect is prevented from occurring in semiconductor substrate 10. Moreover, where necessary to improve the electrical characteristics of a device, more than three impurity regions can be formed in semiconductor substrate 10 between channel holes 50.

Figure 12:
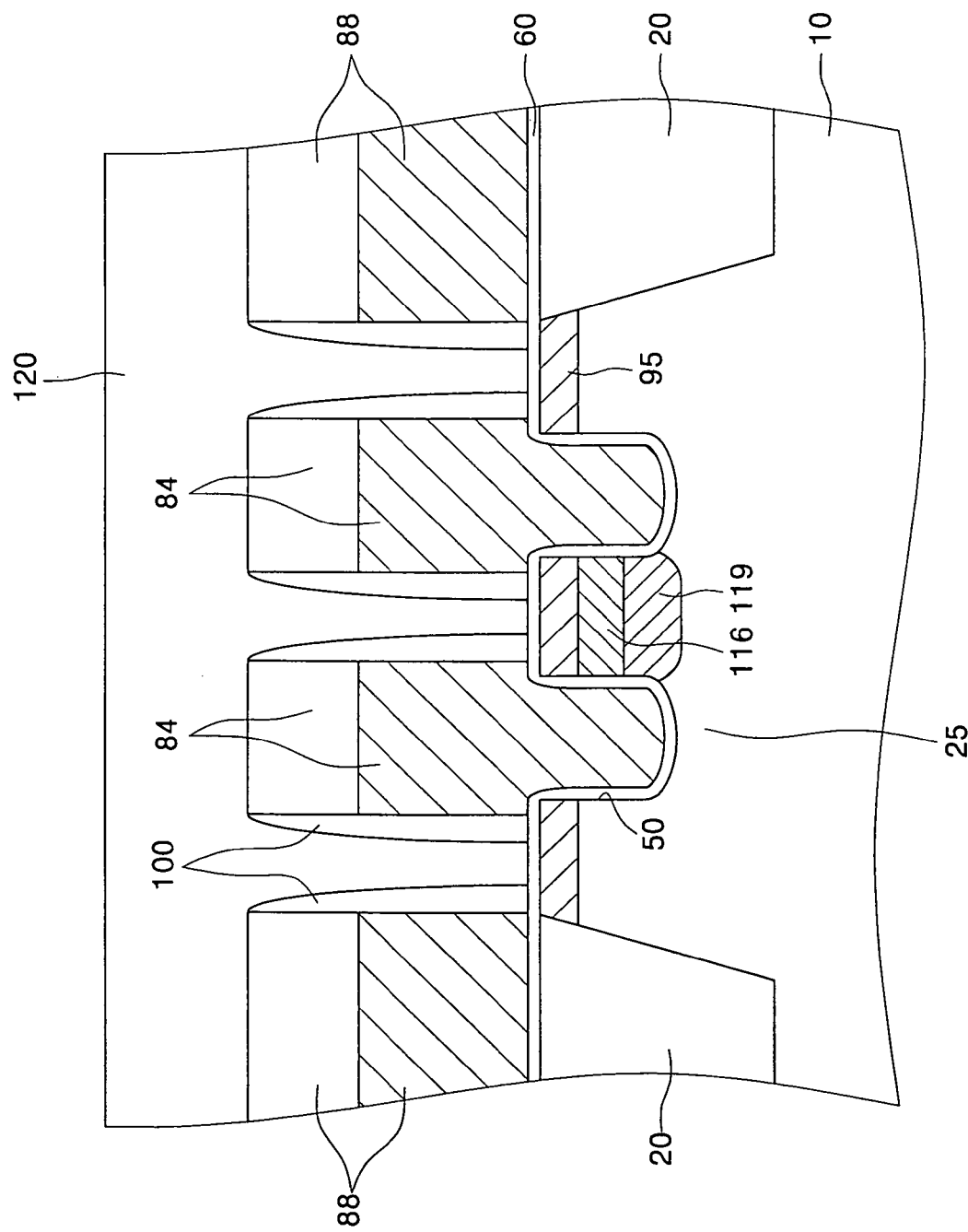

Referring to FIG. 12, a pad insulating interlayer 120 is formed over semiconductor substrate 10. Pad insulating interlayer 120 fills spaces between cell and running gate structures 84 and 88 and covers gate structures 84 and 88. Pad insulating interlayer 120 preferably comprises a layer having a different etch rate from gate spacer 100. Preferably, pad insulating interlayer 120 is formed using a silicon oxide layer containing boron (B) and phosphorus (P).

Figure 13:
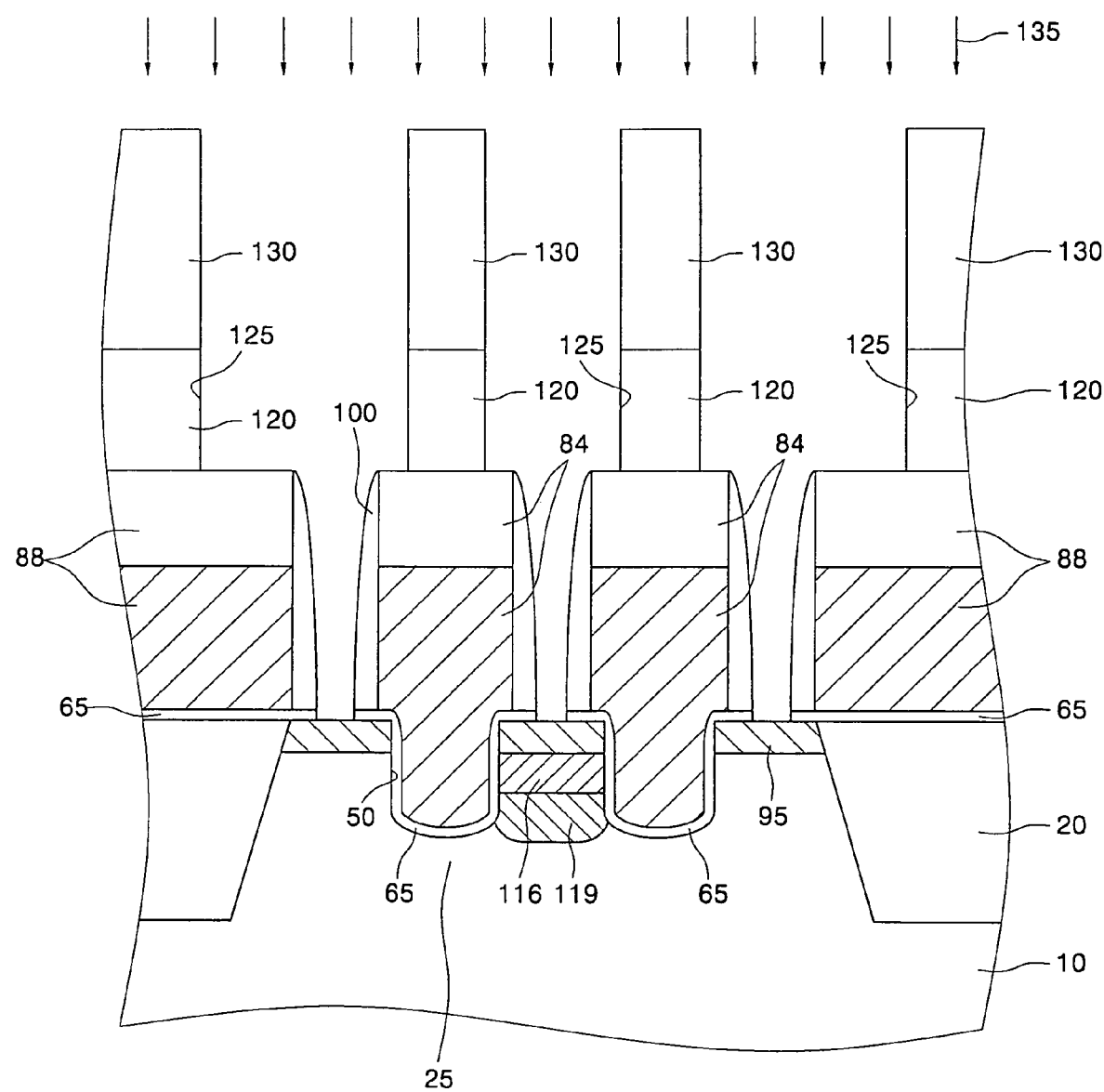

Referring to FIG. 13, a photoresist pattern 130 is formed on pad insulating interlayer 120. Photoresist pattern 130 contains holes exposing pad insulating interlayer 120. Using photoresist pattern 130 as an etching mask, an etching process 135 is performed on pad insulating interlayer 120. Etching process 135 forms pad holes 125 penetrating pad insulating interlayer 120 between cell and running gate structures 84 and 88. Pad holes 125 expose semiconductor substrate 10 along with cell and running gate structures 84 and 88 and gate spacers 100. At this time, a gate insulating pattern 65 is formed between cell gate structures 84 and semiconductor substrate 10 and between running gate structures 88 and device isolation layer 20 respectively.

Figure 14:
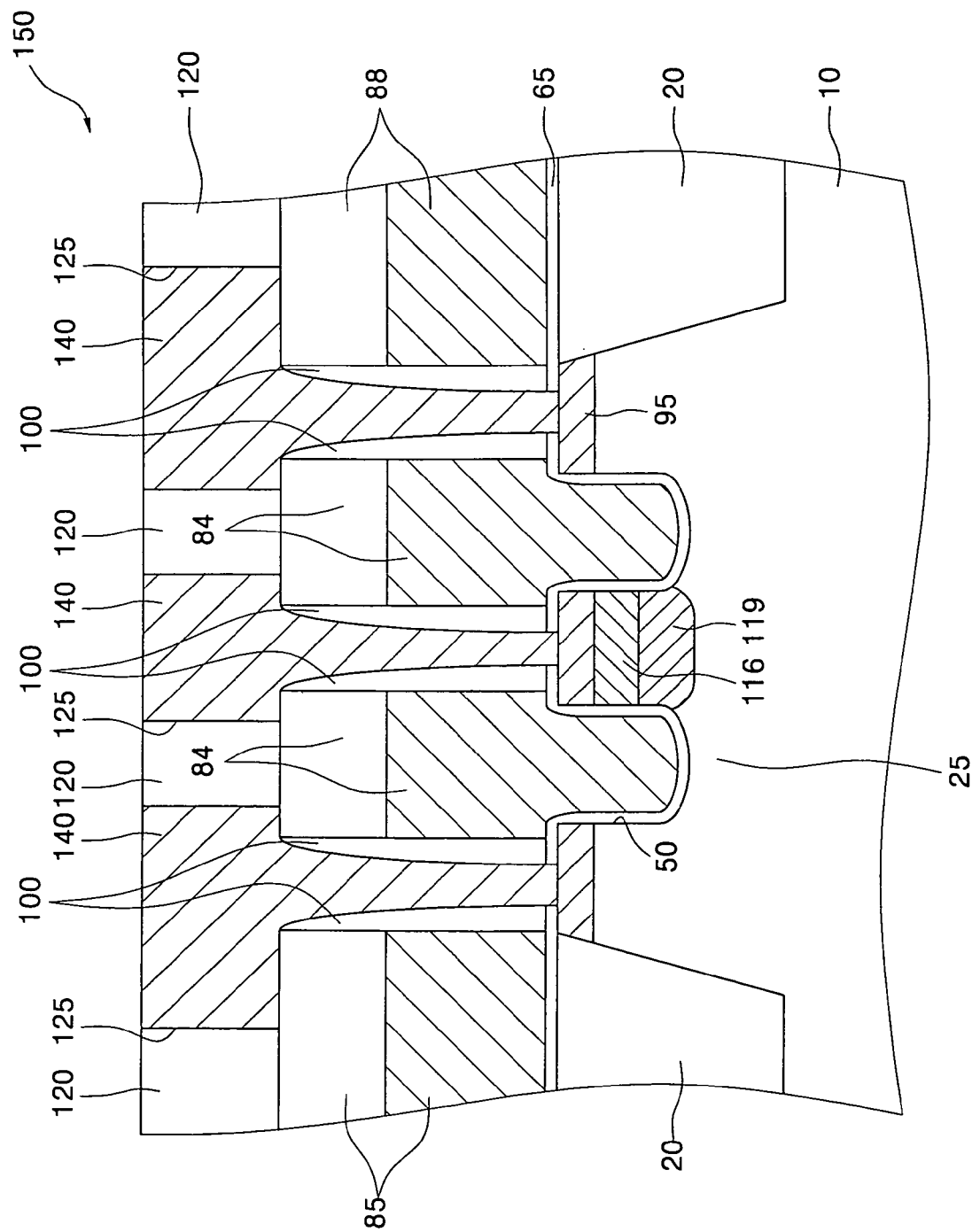

Referring to FIG. 14, landing pads 140 are formed to fill pad holes 125. Landing pads 140 are formed in contact with first impurity regions 95. Preferably, landing pads 140 are formed using an n+-type polysilicon layer. As such, a DRAM 150 having first through third impurity regions 95, 116 and 119 is formed in semiconductor substrate 10 between the channel holes. DRAM 150 has two transistors in one active region. The two transistors share a common source, namely, the first through third impurity regions 95, 116, 119 formed in semiconductor substrate 10 between the cell gate structures 84. One of the transistors has a drain region on one side of the common source region and the other transistor has a drain region on the other side of the common source region.

As described above, embodiments of the invention provide a DRAM comprising a transistor having at least three impurity regions formed between channel holes and methods of fabricating the same. The DRAM maintains stable electrical characteristics across the overall surface of the semiconductor substrate, and furthermore, transistors within the DRAM are produced with a high production yield and improved refresh characteristics.

What is claimed:

1. A dynamic random access memory (DRAM), comprising:
   a device isolation layer formed in a semiconductor substrate, thereby defining an active region of the substrate;
   channel holes formed in the active region and surrounded by the device isolation layer;
   cell gate structures extending upward from the substrate and filling the channel holes;
   running gate structures formed on the device isolation layer in parallel with the cell gate structures;
   first impurity regions of first conductivity type formed in the substrate between the cell gate structures, and between the respective cell gate structures and the respective running gate structures, wherein a first impurity region formed between the respective gate structures has a width defined by a separation distance between the channel holes;
   a second impurity region of first conductivity type having the same width as the first impurity region formed between the cell gate structures and formed in the substrate under the first impurity region formed between the cell gate structures; and,
   a third impurity region of second conductivity type formed in the substrate under the second impurity region.

2. The DRAM of claim 1, further comprising:
   a gate insulating pattern formed between the cell gate structures and the substrate and between the running gate structures and the device isolation layer.

3. The DRAM of claim 2, wherein each of the cell and running gate structures comprises;
   a gate; and,
   a gate capping layer structure stacked on the gate;
   wherein the gate capping layer structure is formed from an insulating layer having a different etch rate relative to the gate insulating pattern.

4. The DRAM of claim 3, wherein the gate comprises:
   an n+-type polysilicon layer; and,
   a metal silicide layer stacked on the n+-type polysilicon layer.

5. The DRAM of claim 1, further comprising:
   pad holes formed between the cell gate structures and between each one of the cell gate structures and the running gate structures;
   a pad insulating interlayer formed on the cell gate structures and running gate structures, thereby isolating the pad holes; and,
   landing pads filling the pad holes and each respectively contacting one of the first impurity regions.

6. The DRAM of claim 5, wherein the landing pads are formed from n+-type polysilicon.

7. The DRAM of claim 5, wherein the pad insulating interlayer comprises a silicon dioxide ($SiO_2$) layer containing boron (B) and phosphorus (P).

8. The DRAM of claim 5, further comprising:
   gate spacers formed between the landing pads and the cell gate structures, and between the landing pads and the running gate structures.

9. The DRAM of claim 8, wherein the gate spacers are formed from an insulating layer having a different etch rate from the pad insulating interlayer.

10. The DRAM of claim 1, wherein the semiconductor substrate has the second conductivity type.

11. A dynamic random access memory (DRAM), comprising:
    a plurality of device isolation layers formed in a semiconductor substrate and defining an active region;
    a plurality of channel holes formed in the active region;
    respective cell gate structures extending upward from the substrate and filling one of the plurality of channel holes;
    running gate structures formed on the device isolation layer in parallel with the cell gate structures;
    a plurality of first source/drain regions formed between one of the plurality of channel holes and one of the plurality of isolation layers, each one of the first source/drain regions consisting of a first impurity region of first conductivity type formed to a first depth in the substrate;

a second source/drain region formed between the plurality of channel holes and comprising; the first impurity region of first conductivity type formed to the first depth, a second impurity region of first conductivity type formed under the first impurity region, and a third impurity region of second conductivity type formed under the second impurity region.

12. The DARM of claim 11, wherein the width of the first impurity region and the width of the second impurity region are the same.

13. DRAM of claim 11, further comprising:
a gate insulating pattern formed between the cell gate structures and the substrate and between the running gate structures and the device isolation layer.

14. The DRAM of claim 11, wherein each of the cell and running gate structures comprises; a gate, and a gate capping layer structure stacked on the gate, wherein the gate capping layer structure is formed from an insulating layer having a different etch rate relative to the gate insulating pattern.

15. The DRAM of claim 14, wherein the gate comprises; an n+-type polysilicon layer, and a metal silicide layer stacked on the n+-type polysilicon layer.

16. The DRAM of claim 11, further comprising:
pad holes formed between the cell gate structures, and between a cell gate structure and a corresponding running gate structure;
a pad insulating interlayer formed on the cell gate structures and running gate structures to isolate the pad holes; and
landing pads filling the pad holes and each respectively contacting one of the plurality of the first source/drain regions or the second source/drain region.

17. The DRAM of claim 16, further comprising:
gate spacers respectively formed between a landing pad and a cell gate structure and between a landing pad and a running gate structure.

* * * * *